United States Patent [19]

Main

[11] Patent Number: 5,751,192
[45] Date of Patent: May 12, 1998

[54] INTEGRATED CIRCUIT AND METHOD FOR GENERATING A TRANSIMPEDANCE FUNCTION

[75] Inventor: William E. Main, Mesa, Ariz.

[73] Assignee: Motorola, Inc., Schaumburg, Ill.

[21] Appl. No.: 706,886

[22] Filed: Sep. 3, 1996

[51] Int. Cl.$^6$ ................................................. H03F 1/34
[52] U.S. Cl. ........................ 330/293; 330/294; 330/110
[58] Field of Search .................................... 330/107, 110, 330/260, 293, 294

[56] References Cited

U.S. PATENT DOCUMENTS

| | | | |
|---|---|---|---|
| 3,613,011 | 10/1971 | Wood | 330/110 |
| 3,914,704 | 10/1975 | Craft | 330/18 |
| 4,088,962 | 5/1978 | Trilling | 330/261 |
| 4,484,148 | 11/1984 | Wieser et al. | 330/260 X |
| 4,785,258 | 11/1988 | Westwick | 330/253 |
| 4,857,863 | 8/1989 | Ganger et al. | 330/264 |

FOREIGN PATENT DOCUMENTS 1140559  1/1969  United Kingdom ............... 330/293

OTHER PUBLICATIONS

"MOS Operational Amplifier Design–A Tutorial Overview". Paul R. Gray and Robert G. Meyer, IEEE Journal of Solid–State Circuits, vol. SC–17, No. 6, Dec. 1982, pp. 969–982.

Primary Examiner—James B. Mullins
Attorney, Agent, or Firm—Rennie William Dover

[57] ABSTRACT

An integrator circuit (10) and a method for generating an output signal that is frequency compensated. The integrated circuit (10) includes an input stage (14) coupled to a transconductance amplifier (11) via a capacitor (13) and a compensation diode (12). The compensation diode (12) provides an impedance that negates an output impedance of the transconductance amplifier (11). The output signal of the integrator circuit (10) is determined by the capacitor (13).

20 Claims, 2 Drawing Sheets

INTEGRATED CIRCUIT AND METHOD FOR GENERATING A TRANSIMPEDANCE FUNCTION

BACKGROUND OF THE INVENTION

The present invention relates, in general, to integrated circuits, and more particularly, to frequency compensated integrated circuits.

Integrated circuit amplifiers are used in a variety of linear and nonlinear circuit applications. For example, they are used in integrator circuits, differentiator circuits, summing circuits, difference circuits, impedance converter circuits, rectifier circuits, peak detector circuits, etc. Generally, it is desirable for these circuits to have a large gain and be stable over a large frequency range, i.e., have a large bandwidth.

Typically, integrated circuit amplifiers include an input terminal and an output terminal. The integrated circuit amplifier can be frequency compensated by coupling the output terminal to the input terminal via a compensation capacitor. The compensation capacitor introduces a dominant low frequency pole into the output response, thereby causing the gain to roll-off at a slope of 20 decibels per decade of frequency (dB/DEC). However, the amplifier negates the roll-off effect of the pole by producing a non-zero output response at high frequencies. Thus, if the gain of the amplifier circuit does not reach unity before the phase angle becomes 180 degrees, the amplifier circuit becomes unstable and oscillates. Further, the output signal may become non-inverted at high frequencies, i.e., frequencies at which the impedance of the compensation capacitor is less than the resistance of the output transistor, thereby limiting the usefulness of the integrated circuit amplifiers at high frequencies.

Accordingly, it would be advantageous to have a method and circuit for providing a stable inverted output signal at high frequencies.

DETAILED DESCRIPTION OF THE DRAWINGS

Generally, the present invention provides an integrator circuit and a method for generating a frequency compensated output signal. The integrator circuit includes a compensation diode, a transconductance amplifier, and a capacitor. The compensation diode provides an impedance that negates the impedance of the transconductance amplifier, thereby making the output signal a function of the capacitor. In a accordance with a method of the present invention a transimpedance function is generated. More particularly, a transconductance amplifier having a transconductance value, an inverting input, and an output terminal is provided. Further, first and second impedances are provided, wherein signal currents flow through the first impedance and create a voltage across the first impedance and signal currents flow through the second impedance and create a voltage across the second impedance. The value of the second impedance is a function of an inverse of the transconductance value of the transconductance amplifier. The voltage across the first and second impedances and the voltage appearing at the inverting input of the transconductance amplifier are summed to produce a voltage which is a function of the first impedance and the input current.

Figure 1:
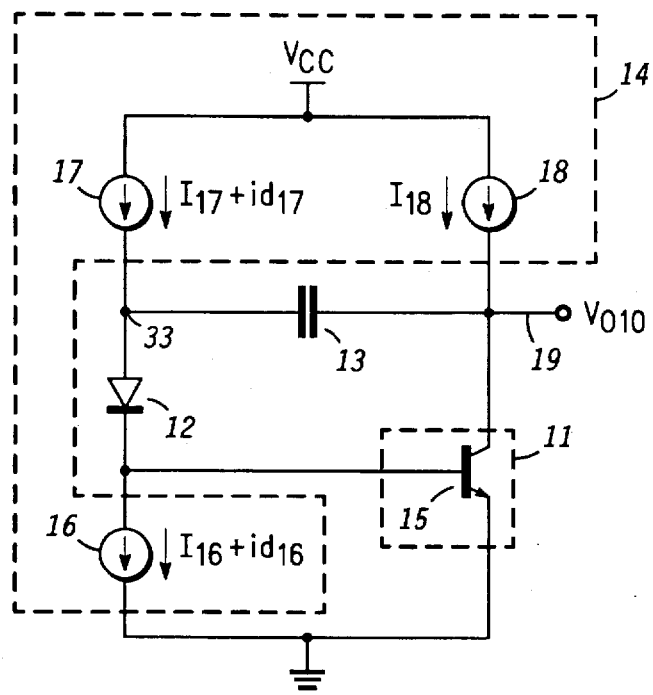
FIG. 1 is a schematic diagram of an example of an integrator circuit in accordance with a first embodiment of the present invention.

FIG. 1 is a schematic diagram of an example of an integrator circuit 10 in accordance with a first embodiment of the present invention. Integrator circuit 10 includes a transconductance amplifier 11, a compensation diode 12, a capacitor 13, and a bias stage 14. By way of example, transconductance amplifier 11 is comprised of an NPN bipolar transistor 15, wherein the base terminal of transistor 11 serves as a control electrode of amplifier 11 and the collector and emitter terminals of transistor 15 serve as the current carrying electrodes of amplifier 11. The emitter of transistor 15 is coupled for receiving a power supply voltage or source of operating potential such as, for example, ground. The base terminal of transistor 15 is connected to the cathode of compensation diode 12. The anode of compensation diode 12 is coupled to the collector terminal of transistor 15 via capacitor 13. In other words, a first terminal of capacitor 13 is connected to the anode of compensation diode 12 and the second terminal of capacitor 13 is connected to the collector of transistor 15. By way of example, compensation diode 12 is a diode-connected transistor.

Input stage 14 includes current sources 16, 17, and 18. A first terminal of current source 16 is connected to the cathode of compensation diode 12 and a second terminal of current source 16 is coupled for receiving a power supply voltage such as ground. Current source 16 sinks current for integrator 10, it is also referred to as a current sink. Current source (or sink) 16 ensures that compensation diode 12 operates in the forward conduction mode. A first terminal of current source 17 is commonly connected to the anode of compensation diode 12 and to the first terminal of capacitor 13. A second terminal of current source 17 is coupled for receiving a power supply voltage or source of operating potential such as, for example, $V_{cc}$. A first terminal of current source 18 is commonly connected to the second terminal of capacitor 13 and to the collector terminal of transistor 15. A second terminal of current source 18 is coupled for receiving a power supply voltage such as, for example, $V_{cc}$. A node 19 formed by the common connection of the collector terminal of transistor 15, the second terminal of capacitor 13, and the first terminal of current source 18 serves as an output node or terminal at which an output signal $v_{o10}$ appears. A suitable circuit configuration for bias stage 14 may be a current source and a two transistor current mirror. This effectively cancels the base current of transistor 15 and improves the balance when the average direct current (dc) current of transistor 15 is twice that of the current mirror transistors.

In operation, bias stage 14 provides bias or quiescent currents $I_{16}$, $I_{17}$, and $I_{18}$ via current sources 16, 17, and 18, respectively. In addition, current sources 16 and 17 cooperate to provide differential small signal currents "$i_{d16}$" and "$i_{d17}$", respectively. Preferably, bias currents $I_{16}$ and $I_{17}$ are of equal value and bias current $I_{18}$ is twice the value of bias currents $I_{16}$ and $I_{17}$. Accordingly, the emitter resistance of transistor 15 is half the emitter resistance of diode connected transistor 12. It should be noted that small signal currents "$i_{d16}$" and "$i_{d17}$" are differential currents that flow into node 33, which is an alternating current (ac) or virtual ground. Thus, capacitor 13 is coupled for receiving a differential current which is the sum of the currents $i_{d16}$ and $i_{d17}$. In accordance with the first embodiment of the present invention, currents $i_{d16}$ and $i_{d17}$ are of equal value and are typically identified by the letter "i". Using the notation "i" to represent currents $i_{d16}$ and $i_{d17}$, the current flowing through capacitor 13 has a value of "2*i" and the current flowing through compensation diode 12 has a value of "i." Accordingly, the transfer function for integrator 10 is given by equation 1 (EQT. 1) as:

$$v_{o10} = \Delta V_{be15} + \Delta V_{be12} - (2*i/s*C_{13}) \qquad \text{EQT. 1}$$

where:

$v_{o10}$ is the output voltage of integrator circuit 10;

$\Delta V_{be15}$ is the small signal change in base-emitter voltage of transistor 15;

$\Delta V_{be12}$ is the small signal voltage change of diode 12;

2*i is the small signal current;

s is a complex number representing a complex frequency; and $C_{13}$ is the capacitance value of capacitor 13.

EQT. 1 can be rewritten as equation 2 (EQT. 2):

$$v_{o10} = 2*i*r_{e15} - i*r_{e12} - 2*i/s*C_{13} \qquad \text{EQT. 2}$$

where:

$r_{e15}$ is the emitter resistance of transistor 15; and $r_{e12}$ is the emitter resistance of diode-connected transistor 12.

Because the emitter resistance of transistor 15 is half that of diode connected transistor 12, EQT. 2 can be written as equation 3 (EQT. 3):

$$v_{o10} = -2*i/s*C_{13} \qquad \text{EQT. 3}$$

Thus, compensation diode 12 provides an impedance that negates the emitter resistance of transistor 15. More particularly, transistor 11 and compensation diode 12 are biased such that the impedance of compensation diode 12 and the emitter resistance of transistor 15 in combination with the small signal current flowing through them cancel each other. Accordingly, the output signal is only a function of capacitor 13. It should be noted that the output signal of integrator 10 is inverting and has a gain roll-off having a slope of 20 dB/DEC. Thus, integrator circuit 10 is suitable for use in feedback applications.

Although feedback element 13 is shown as a capacitor, it should be noted that this is not a limitation of the present invention. Feedback element 13 may be a load impedance such as a resistor, a series combination of a resistor and a capacitor, or the like. Preferably, the impedance of feedback element 13 is not more than approximately 10 times the small signal resistance of transconductance amplifier 14.

Figure 2:
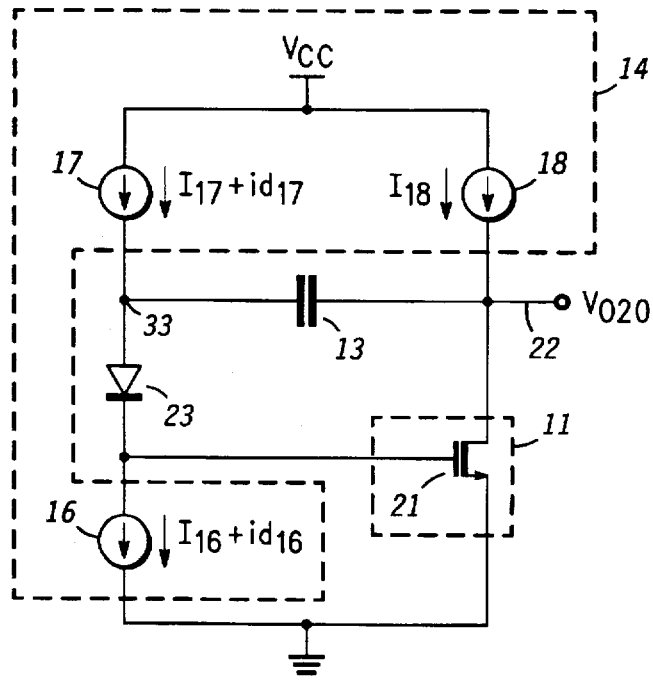
FIG. 2 is a schematic diagram of another example of an integrator circuit in accordance with the first embodiment of the present invention.

FIG. 2 is a schematic diagram of another example of an integrator circuit 20 in accordance with the first embodiment of the present invention. It should be understood that the same reference numerals are used in the figures to denote the same elements. Integrator circuit 20 is similar to integrator circuit 10 of FIG. 1 except that a field effect transistor 21 serves as transconductance amplifier 11 and diode 23 is preferably formed from a diode connected field effect transistor. Thus, a gate of field effect transistor 21 serves as the control electrode of transconductance amplifier 11 and the drain and source serve as current conducting electrodes. The drain of transistor 21 is also coupled to the anode of compensation diode 23 through capacitor 13. A node 22 common to the second terminal of capacitor 53, the drain of transistor 21, and the first terminal of current source 18 serves as an output node or terminal at which an output signal $V_{o20}$ appears. The transfer function for integrator circuit 20 is given by equation 4 (EQT. 4) as:

$$v_{o20} = \Delta V_{ds21} + \Delta V_{ds23} - (2*i/s*C_{13}) \qquad \text{EQT. 4}$$

where:

$v_{o20}$ is the output voltage of integrator circuit 20;

$\Delta V_{ds21}$ is the small signal voltage change of the drain-source voltage of transistor 21;

$\Delta V_{ds23}$ is the small signal voltage change of the voltage of diode 23;

2*i is the small signal current;

s is a complex number representing a complex frequency; and $C_{13}$ is the capacitance value of capacitor 13.

EQT. 4 can be rewritten as equation 5 (EQT. 4):

$$v_{o20} = 2*i*r_{d21} - i*r_{d23} - 2*i/s*C_{13} \qquad \text{EQT. 5.}$$

where:

$r_{d21}$ is the emitter resistance of transistor 21; and $r_{d23}$ is the emitter resistance of diode-connected transistor 23.

Because the drain-source resistance of transistor 21 is half that of diode connected transistor 23, EQT. 5 can be written as equation 6 (EQT. 6):

$$v_{o20} = -2*i/s*C_{13} \qquad \text{EQT. 6.}$$

It should be noted that similar to integrator circuit 10, the output of integrator circuit 20 is inverting and has a gain roll-off having a slope of 20 dB/DEC.

Figure 3:
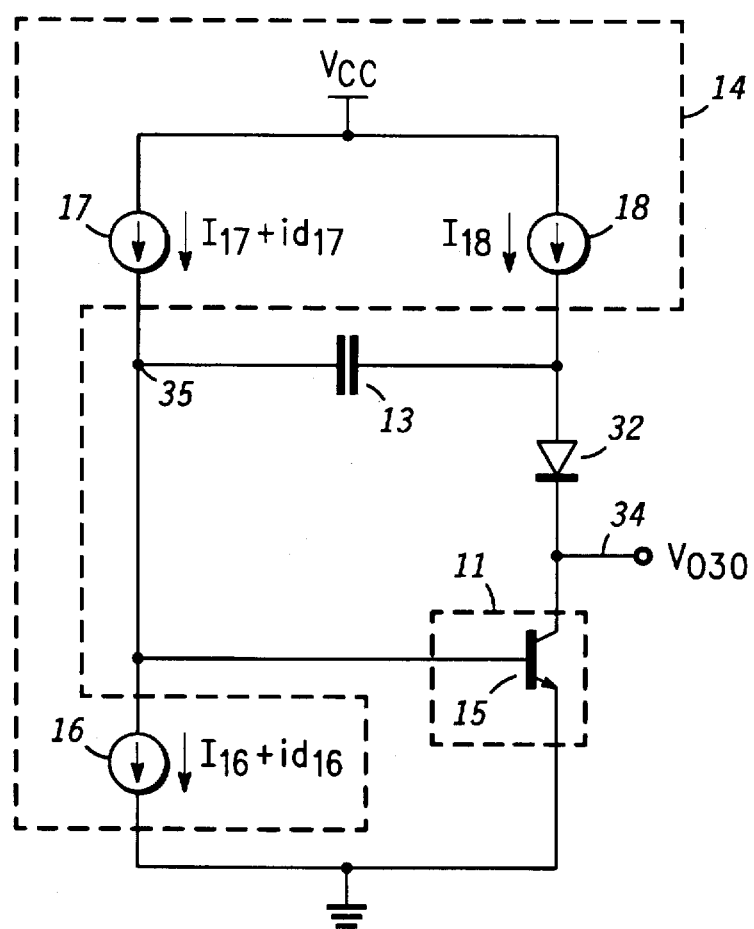
FIG. 3 is a schematic diagram of an integrator circuit in accordance with a third embodiment of the present invention.

FIG. 3 is a schematic diagram of an integrator circuit 30 in accordance with a second embodiment of the present invention. Integrator circuit 30 includes a transconductance amplifier 11, a capacitor 13, a compensation diode 32, and a bias stage 14. It should be understood that the same reference numerals are used in the figures to denote the same elements. By way of example, transconductance amplifier 11 is comprised of an NPN bipolar transistor 15, wherein the base terminal of transistor 15 serves as a control electrode of transconductance amplifier 11 and the collector and emitter terminals of transistor 15 serve as the current carrying electrodes of transconductance amplifier 11. The emitter of transistor 15 is coupled for receiving a power supply voltage such as, for example, ground. The base terminal of transistor 15 is connected to the first terminal of capacitor 13. The second terminal of capacitor 13 is coupled to the collector terminal of transistor 15 via capacitor 13. In other words, a first terminal of capacitor 13 is connected to the base of transistor 15 and the second terminal of capacitor 13 is connected to the anode of compensation diode 32.

Input stage 14 includes current sources 16, 17, and 18. A first terminal of current source 16 is connected to the base terminal of transistor 15 and a second terminal of current source 16 is coupled for receiving a power supply voltage or source of operating potential such as, for example, ground. A first terminal of current source 17 is commonly connected to the first terminal of capacitor 13 and to the base terminal of transistor 15. A second terminal of current source 17 is coupled for receiving a power supply voltage or source of operating potential such as, for example, $V_{cc}$. A first terminal of current source 18 is commonly connected to the second terminal of capacitor 13 and to the anode of diode-connected transistor 32. A second terminal of current source 18 is coupled for receiving a power supply voltage such as, for example, $V_{cc}$. A node 34 formed by the connection of the collector terminal of transistor 15 and the anode of compensation diode 32 serves as an output node or terminal at which an output signal $v_{o30}$ appears.

In operation, bias stage 14 provides bias or quiescent currents $I_{16}$, $I_{17}$, and $I_{18}$ via current sources 16, 17, and 18, respectively. In addition, current sources 16 and 17 cooperate to provide differential small signal currents "$i_{d16}$" and "$i_{d17}$", respectively. Preferably, bias currents $I_{16}$ and $I_{17}$ are of equal value. Accordingly, the emitter resistances of diode-connected transistor 32 and transistor 15 are the same. It should be noted that small signal currents "$i_{d16}$" and "$i_{d17}$" are differential currents that flow into node 35, which is an alternating current (ac) or virtual ground. Thus, the current flowing through capacitor 13 is the sum of the currents $i_{d16}$ and $i_{d17}$. In accordance with the second embodiment of the present invention, currents $i_{d16}$ and $i_{d17}$ are of equal value, thus the currents are also designated as having a value "i". Using the notation "i" to represent currents $i_{d16}$ and $i_{d17}$, the current flowing through capacitor 13 has a value of "2*i" and the current flowing through compensation diode 32 has a value of "2*i." Accordingly, the transfer function for integrator 10 is given by equation 7 (EQT. 7) as:

$$v_{o30} = \Delta V_{be15} - \Delta V_{be32} - (2*i/s*C_{13}) \quad \text{EQT. 7}$$

where:

$v_{o30}$ is the output voltage of integrator circuit 30;

$\Delta V_{be14}$ is the small signal change in base-emitter voltage of transistor 15;

$\Delta V_{be32}$ is the small signal change in voltage of diode 32;

2*i is the small signal current;

s is a complex number representing a complex frequency; and $C_{13}$ is the capacitance value of capacitor 13.

EQT. 7 can be rewritten as equation 8 (EQT. 8):

$$v_{o30} = 2*i*r_{e15} - 2*i*r_{e32} - 2*i/s*C_{13} \quad \text{EQT. 8}$$

Because the emitter resistance of transistor 15 is the same as that of diode connected transistor 32 EQT. 8 can be written as equation 9 (EQT. 9):

$$v_{o30} = -2*i/s*C_{13} \quad \text{EQT. 9}$$

Thus, compensation diode 32 provides an impedance that negates the emitter resistance of transistor 34. More particularly, transistor 34 and compensation diode 32 are biased such that the impedance of compensation diode 32 and the emitter resistance of transistor 34, in combination with the small signal current flowing through them, cancel each other. Accordingly, the output signal is only a function of capacitor 13. It should be noted that the output signal of integrator 30 is inverting and has a gain roll-off having a slope of 20 dB/DEC. Thus, integrator circuit 30 is suitable for use in feedback applications.

Although feedback element 13 is shown as a capacitor, it should be noted that this is not a limitation of the present invention. Feedback element 13 may be a load impedance such as a resistor, a series combination of a resistor and a capacitor, or the like.

By now it should be appreciated that an integrated circuit and a method for providing a frequency compensated output signal have been provided. The integrated circuit is useful in integrators, operational amplifiers, etc. An advantage of the present invention is that it provides an increased range of integration in integrator circuit applications and an increased frequency range in amplifier applications.

I claim:

1. An integrated circuit, comprising:

a transconductance amplifier having a control electrode, a first current carrying electrode, and a second current carrying electrode, the first current carrying electrode coupled for receiving a bias current and the second current carrying electrode coupled for receiving a first source of operating potential;

a load impedance having a first terminal and a second terminal, the first terminal coupled for receiving a differential current and the second terminal coupled to the first current carrying electrode of the transconductance amplifier, the second terminal serving as an output of the integrated circuit;

a diode having first and second terminals, the first terminal coupled to the first terminal of the load impedance and the second terminal coupled to the control electrode of the transconductance amplifier;

a current source coupled to the first terminal of the diode; and a current sink coupled to the second terminal of the diode, such that the diode is biased into a forward conductive mode of operation.

2. The integrated circuit of claim 1, wherein the transconductance amplifier is a transistor.

3. The integrated circuit of claim 2, wherein the transistor is a bipolar transistor.

4. The integrated circuit of claim 2, wherein the transistor is a field effect transistor.

5. The integrated circuit of claim 1, wherein the diode is a diode-connected transistor.

6. The integrated circuit of claim 1, wherein the load impedance is a capacitor.

7. The integrated circuit of claim 1, further including a bias stage which provides differential currents to the first terminal of the load impedance.

8. The integrated circuit of claim 7, wherein the bias stage further includes another current source, the another current source coupled to the first current carrying electrode of the transconductance amplifier.

9. An integrated circuit, comprising:

an input stage having first, second, and third output terminals;

a transconductance amplifier having a control electrode, a first current carrying electrode, and a second current carrying electrode, the control electrode coupled to the first and third output terminals of the input stage; and the second current carrying electrode coupled for receiving a first source of operating potential;

a load impedance having a first terminal and a second terminal, the first terminal of the load impedance coupled to the first output terminal of the input stage; and a diode having first and second terminals, the first terminal of the diode coupled to the first current carrying electrode of the transconductance amplifier and the second terminal of the diode coupled to the second output terminal of the input stage and to the second terminal of the load impedance.

10. The integrated circuit of claim 9, wherein the transconductance amplifier is a transistor, the diode is a diode-connected transistor, and the load impedance is a capacitor.

11. The integrated circuit of claim 10, wherein the transistor is a bipolar transistor.

12. The integrated circuit of claim 9, wherein the input stage further includes first and second current sources, the first current source having at least one current carrying terminal, the at least one current carrying terminal of the first current source coupled to the first terminal of the load impedance and the second current source having at least one current carrying terminal, the at least one current carrying terminal of the second current source coupled to the control electrode of the transconductance amplifier.

13. The integrated circuit of claim 12, wherein the first current source provides a first current and the second current source provides a second current, the first and second currents cooperating to form a differential current.

14. The integrated circuit of claim 12, further including a third current source coupled to the second terminal of the load impedance.

15. An integrated circuit, comprising:

a transconductance amplifier having a control electrode, a first current carrying electrode, and a second current carrying electrode, the first current carrying electrode coupled for receiving a first source of operating potential;

a diode having first and second terminals, the first terminal coupled for receiving a bias current, and the second terminal coupled to the second current carrying electrode of the transconductance amplifier; and a load impedance having a first terminal and a second terminal, the first terminal coupled to the control electrode of the transconductance amplifier for receiving a differential current and the second terminal coupled to the first terminal of the diode.

16. The integrated circuit of claim 15, wherein the load impedance is a capacitor.

17. A method for generating a transimpedance function, comprising the steps of:

providing a transconductance amplifier having a transconductance value, an inverting input and an output terminal;

providing a first impedance between the output terminal of the transconductance amplifier and the inverting input of the transconductance amplifier, wherein signal currents flow through the first impedance and create a voltage across the first impedance;

providing a second impedance having a value that is the inverse of the transconductance value of the transconductance amplifier, wherein signal currents flow through the second impedance and create a voltage across the second impedance; and summing the voltage across the first and second impedances and the voltage appearing at the inverting input of the transconductance amplifier such that the voltage across the second impedance caused by the signal currents in the second impedance cancels the voltage at the inverting input of the transconductance amplifier thereby producing a voltage which is a function only of the first impedance and an input current.

18. The method of claim 17, wherein the step of providing the first impedance includes providing a capacitor.

19. The method of claim 17, wherein the step of providing a second impedance includes providing a diode.

20. The method of claim 17, wherein the step of providing a transconductance amplifier includes providing a bipolar transistor.

* * * * *